(12) United States Patent
Kawanishi et al.

(10) Patent No.: US 8,962,370 B2
(45) Date of Patent: Feb. 24, 2015

(54) RADIATION DETECTOR AND METHOD OF MANUFACTURING THE SAME

(71) Applicant: Sony Corporation, Tokyo (JP)

(72) Inventors: Mitsuhiro Kawanishi, Tokyo (JP); Ikumi Kusayama, Kanagawa (JP); Takahiro Igarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/919,603

(22) Filed: Jun. 17, 2013

(65) Prior Publication Data

US 2014/0015082 A1    Jan. 16, 2014

(30) Foreign Application Priority Data

Jul. 12, 2012    (JP) ................. 2012-156183

(51) Int. Cl.
*H01L 21/00* (2006.01)
*H01L 31/115* (2006.01)

(52) U.S. Cl.
CPC .................. *H01L 31/115* (2013.01)
USPC ............. 438/59; 438/64; 438/65; 250/362; 250/367; 250/370; 250/370.11

(58) Field of Classification Search
CPC ..................................... H01L 31/115
See application file for complete search history.

(56) References Cited

U.S. PATENT DOCUMENTS

2007/0205371 A1* 9/2007 Inoue .................. 250/370.11
2008/0083877 A1* 4/2008 Nomura et al. ......... 250/370.11

FOREIGN PATENT DOCUMENTS

JP    2008-051793    3/2008

* cited by examiner

*Primary Examiner* — Kyoung Lee
(74) *Attorney, Agent, or Firm* — Sony Corporation

(57) ABSTRACT

A radiation detector includes a sensor substrate and a scintillator layer. The sensor substrate is configured to be capable of performing photoelectric conversion. The scintillator layer includes a first area and a second area, the first area including an activator, the second area including the activator with a concentration lower than the concentration of the activator in the first area, the scintillator layer being provided on the sensor substrate so that the first area and the second area are arranged in a thickness direction of the scintillator layer and the first area is arranged from an end portion on a side of the sensor substrate in the scintillator layer in the thickness direction.

15 Claims, 7 Drawing Sheets

| Thickness of high-concentration area (μm) | Diameter of root portion of columnar crystal (μm) | Diameter of tip portion of columnar crystal (μm) | Resolution @1lp/mm | Brightness ratio (%) |
|---|---|---|---|---|
| 0 | 1.1 | 5.0 | 100 | 100 |
| 25 | 3.5 | 5.3 | 113 | 115 |
| 50 | 3.7 | 6.5 | 107 | 125 |
| 75 | 4.0 | 10.7 | 98 | 128 |
| 100 | 4.5 | 17.0 | 80 | 123 |

| Tl concentration ratio (times) | Diameter of root portion of columnar crystal (μm) | Diameter of tip portion of columnar crystal (μm) | Resolution @1lp/mm | Brightness ratio (%) |
|---|---|---|---|---|
| 1.0 | 1.1 | 5.0 | 100 | 100 |
| 1.1 | 2.2 | 5.2 | 110 | 110 |
| 1.2 | 3.5 | 5.3 | 113 | 115 |
| 1.3 | 5.5 | 6.5 | 103 | 110 |
| 1.4 | 10.2 | 13.5 | 55 | 92 |

RADIATION DETECTOR AND METHOD OF MANUFACTURING THE SAME

CROSS REFERENCES TO RELATED APPLICATIONS

The present application claims priority to Japanese Priority Patent Application JP 2012-156183 filed in the Japan Patent Office on Jul. 12, 2012, the entire content of which is hereby incorporated by reference.

BACKGROUND

The present disclosure relates to a radiation detector used for radiography for medical use, non-destructive inspection, or the like, and to a method of manufacturing the same.

A radiation detecting apparatus disclosed in Japanese Patent Application Laid-open No. 2008-051793 includes a sensor substrate including a light detector, and a scintillator layer provided on the sensor substrate. The scintillator layer includes all aggregate of columnar crystals, and has a concentration distribution such that the concentration of an activator such as thallium (Tl) is high on the incident side of radiation and low on the side of the light detector. By providing the scintillator layer having such a concentration distribution, the amount of light emission is increased (see, for example, paragraphs [0032], [0034], and [0093] in the specification of Japanese Patent Application Laid-open No. 2008-051793).

SUMMARY

In order to attain a radiation detector having high sensitivity, the configuration of the radiation detector needs to be further devised.

There is a need for providing a radiation detector having high sensitivity and a method of manufacturing the same.

According to an embodiment of the present disclosure, there is provided a radiation detector including a sensor substrate and a scintillator layer.

The sensor substrate is configured to be capable of performing photoelectric conversion.

The scintillator layer includes a first area and a second area, the first area including an activator, the second area including the activator with a concentration lower than the concentration of the activator in the first area. Moreover, the scintillator layer is provided on the sensor substrate so that the first area and the second area are arranged in a thickness direction of the scintillator layer and the first area is arranged from an end portion on a side of the sensor substrate in the scintillator layer in the thickness direction.

The concentration distribution of the activator is set such that the concentration of the activator in the first area, which is close to the sensor substrate, is higher than that in the second area, which is far from the sensor substrate. Accordingly, a scintillator layer having properties of good radiation conversion efficiency can be formed. Specifically, it is possible to attain a radiation detector having high sensitivity.

The scintillator layer may have a thickness of not less than 300 μm and not more than 800 μm.

The scintillator layer may include a phosphor material of CsI as a main component, and the activator may be Tl.

The first area may have a thickness of not less than 2% and not more than 20% of the thickness of the scintillator layer. Alternatively, the thickness of the first area may be not less than 5% and not more than 15% of the thickness of the scintillator layer.

The concentration of the activator in the first area may be not less than 1.1 times and not more than 1.3 times that in the second area. Alternatively, the concentration of the activator in the first area may be 1.2 times that in the first area.

A radiation detector according to another embodiment of the present disclosure includes a sensor substrate, a counter substrate, and a scintillator layer.

The sensor substrate is configured to be capable of performing photoelectric conversion.

The counter substrate is provided so as to face the sensor substrate.

The scintillator layer is provided on the sensor substrate between the sensor substrate and the counter substrate so as to have a thickness of not less than 300 μm and not more than 800 μm. The scintillator layer includes a first area and a second area, the first area including an activator and being provided so as to have a thickness of not less than 10 μm and not more than 100 μm, the second area including the activator with a concentration lower than the concentration of the activator in the first area. Moreover, the scintillator layer is provided on the sensor substrate so that the first area and the second area are arranged in a thickness direction of the scintillator layer and the first area is arranged from an end portion on a side of the counter substrate in the scintillator layer in the thickness direction.

In the radiation detector, in contrast to the configuration of the above-mentioned radiation detector, the concentration distribution of the activator is set such that the concentration of the activator in the first area, which is close to the counter substrate, is higher than that in the second area, which is far from the counter substrate. In this case, by setting the thickness of the first area within the range of the above-mentioned values, it is possible to attain a scintillator layer having properties of good radiation conversion efficiency. Specifically, it is possible to attain a radiation detector having high sensitivity.

A method of manufacturing a radiation detector according to an embodiment of the present disclosure includes forming a first area on a sensor substrate, the first area including an activator, the sensor substrate being configured to be capable of performing photoelectric conversion.

A scintillator layer is formed by forming a second area on the formed first area, the second area including the activator with a concentration higher than the concentration of the activator in the first area, the scintillator layer including the first area and the second area.

A method of manufacturing a radiation detector according to another embodiment of the present disclosure includes forming a first area on a counter substrate, the first area including an activator and being provided so as to have a thickness of not less than 10 μm and not more than 100 μm.

A scintillator layer is formed by forming a second area on the formed first area, the second area including the activator with a concentration lower than the concentration of the activator in the first area, the scintillator layer including the first area and the second area and having a thickness of not less than 300 μm and not more than 800 μm.

According to the present disclosure, it is possible to attain a radiation detector having high sensitivity.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

DETAILED DESCRIPTION

Hereinafter, embodiments according to the present disclosure will be described with reference to the drawings.

Figure 1:
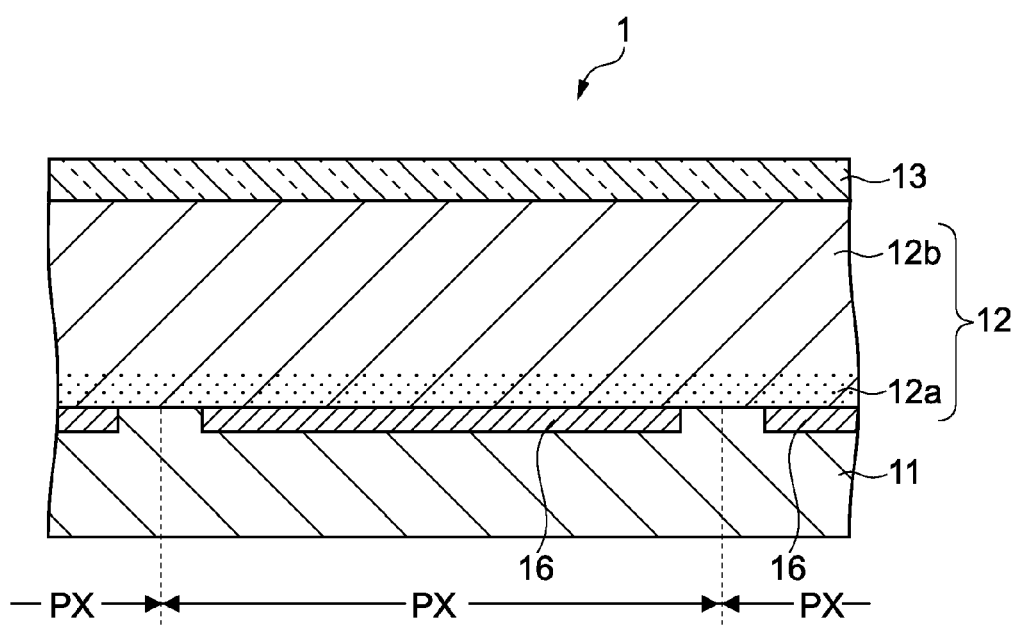
FIG. 1 shows a part of a cross-sectional configuration of a radiation detector according to an embodiment of the present disclosure.

FIG. 1 shows a part of a cross-sectional configuration of a radiation detector according to an embodiment of the present disclosure.

Configuration of Radiation Detector

A radiation detector 1 is a panel that converts radiation typified by α-rays, β-rays, γ-rays, and X-rays into visible light to receive the light, and reads image information based on the radiation as an electric signal. The radiation detector 1 is favorably used as an X-ray imaging apparatus for not only medical use but also other non-destructive inspection such as baggage inspection. The radiation detector 1 includes a sensor substrate 11, a scintillator layer 12 provided on the sensor substrate 11, and a reflective layer 13 provided on the scintillator layer 12. On the reflective layer 13, a protection film (not shown) may be formed.

(Sensor Substrate)

In FIG. 1, the configuration of the sensor substrate 11 is simply described. The sensor substrate 11 includes a pixel portion (pixel portion 10 to be described later) including a plurality of pixels PX, which are capable of performing photoelectric conversion. The sensor substrate 11 is configured so that a pixel drive circuit for driving the pixel portion 10 is disposed on the peripheral area of the pixel portion 10. As shown in FIG. 1, the pixel portion 10 includes a switching element (transistor Tr to be described later) such as a TFT (thin film transistor), and a photodiode 16 being a photoelectric conversion element for each of the pixels PX. Various known configurations and arrangements can be applied to the elements.

From a viewpoint of durability or reduction in weight, the sensor substrate 11 favorably has a thickness of 50 to 1000 μm. The details (pixel circuit and cross-sectional configuration) of the pixel portion 10 in the sensor substrate 11, and the configuration of the peripheral circuit (pixel drive circuit) will be described later.

(Scintillator Layer)

The scintillator layer 12 is a layer containing a radiation phosphor, which emits fluorescence in response to irradiation of radiation. As a phosphor material, a material that absorbs energy from radiation, has high conversion efficiency of the energy into an electromagnetic wave having a wavelength of 300 nm to 800 nm, i.e., an electromagnetic wave (light) in the range from ultraviolet light to infrared light centering on visible light, and easily forms a columnar crystalline structure by deposition, is used. This is because, as will be described later, by forming a columnar crystalline structure, visible light is prevented from scattering in a crystal by a light guide effect, and a film thickness of the scintillator layer 12 can be thickened, thereby obtaining high image resolution.

As a specific phosphor material, it is favorable to use CsI as a main component, and to use, for example, Tl as an activator for enhancing light emission efficiency. In addition, NaI may be used as a main component, and Na may be used as an activator.

The scintillator layer 12 favorably has a thickness of, for example, not less than 300 μm and not more than 800 μm.

As described above, the scintillator layer 12 includes a plurality of columnar crystals. The columnar crystal will be described later in detail with reference to FIG. 6.

As shown in FIG. 1, the scintillator layer 12 mainly includes an area of two layers. Specifically, the scintillator layer 12 includes a high-concentration area (first area) 12a having a relatively high concentration of an activator, and a low-concentration area (second area) 12b having a concentration of the activator lower than that in the first area.

As described above, in the case where the entire thickness of the scintillator layer 12 is not less than 300 μm and not more than 800 μm, e.g., 500 μm, and where a phosphor material contains CsI and Tl, the thickness of the high-concentration area 12a can be set to not less than 10 μm and not more than 100 μm (not less than 2% and not more than 20% of the thickness of the scintillator layer). The thickness of the high-concentration area 12a can be favorably set to not less than 25 μm and not more than 75 μm (not less than 5% and not more than 15% of the thickness of the scintillator layer). The proportion is not limited to the case where the scintillator layer has a thickness of 500 μm, and can be generalized and universalized.

Moreover, the concentration of Tl in the high-concentration area 12a can be favorably set to not less than 1.1 times and not more than 1.3 times that in the low-concentration area 12b. The reason of setting of the value range will be described when explaining a method of manufacturing the scintillator layer 12 later.

(Reflective Layer)

As the reflective layer 13, a metal thin film such as Al, Ag, and Cu, a sheet obtained by mixing a particle such as $TiO_2$ and $BaCO_3$ in resin, or the like may be used.

Configuration of Sensor Substrate (Pixel Portion and Peripheral Circuit)

Figure 2:
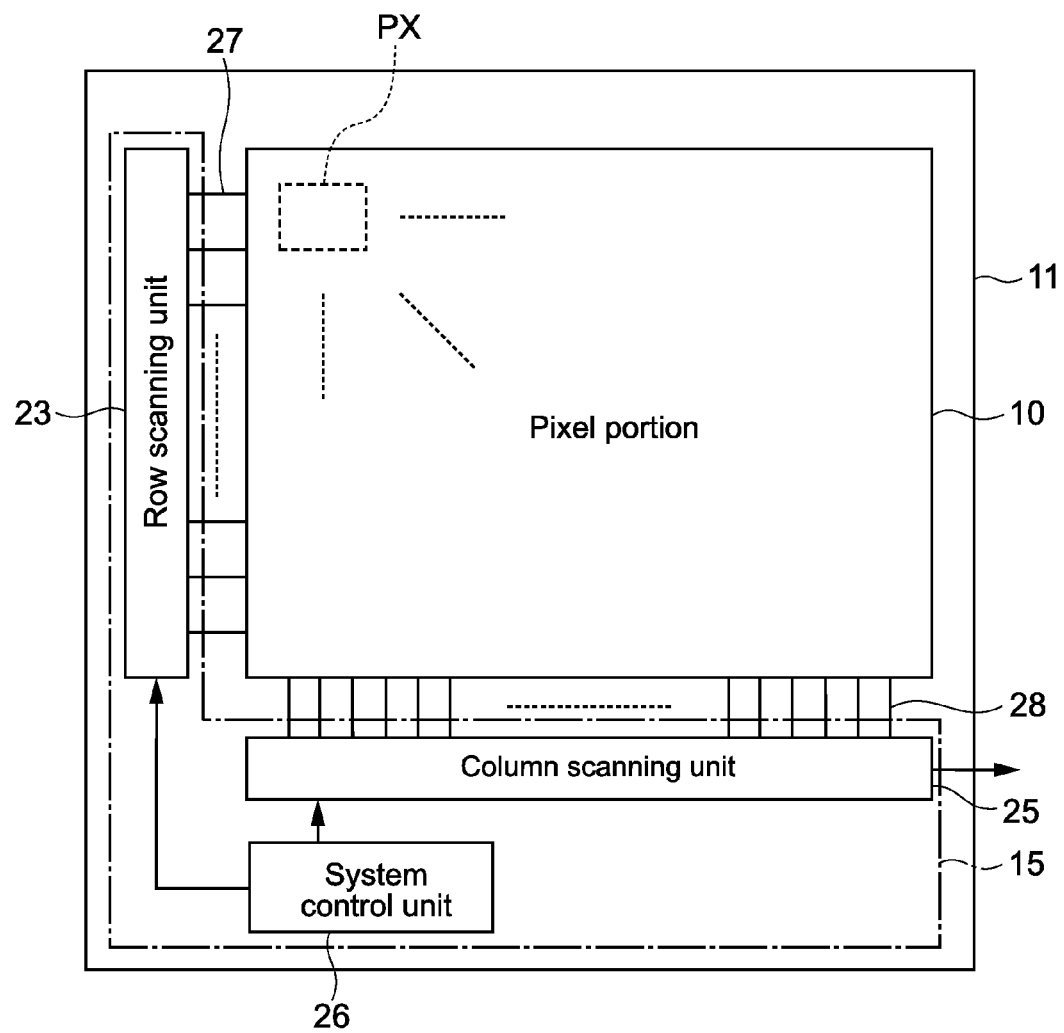
FIG. 2 schematically shows examples of a pixel portion in a sensor substrate and a pixel drive circuit disposed on the peripheral area of the pixel portion.

FIG. 2 schematically shows examples of the pixel portion 10 in the sensor substrate 11 and a pixel drive circuit disposed on the peripheral area of the pixel portion 10. As described above, in the sensor substrate 11, a circuit portion 15 for driving the pixel portion 10 is disposed on the periphery of the pixel portion 10. In the pixel portion 10, the pixels (unit pixels) PX including the photodiodes 16 and transistors are arranged in a matrix pattern. The respective pixels PX are connected to a pixel drive line 27 (specifically, row selection line) and a signal line 28.

The circuit portion 15 includes, for example, a row scanning unit 23, a column scanning unit 25, and a system control unit 26. The row scanning unit 23 is configured to include a shift register, an address decoder, and the like, and drives the pixel portion 10 in a row unit by supplying a drive signal to the pixel portion 10 through the pixel drive line 27. The column scanning unit 25 includes a shift register, an address decoder, and the like. The column scanning unit 25 sequentially receives signals depending on the amount of received light of the photodiode 16 provided on the respective pixels PX, which are output from signal lines, and outputs the signals to the outside.

It should be noted that a circuit portion including the row scanning unit 23, the column scanning unit 25, and the system control unit 26 may be a circuit integrated on the sensor substrate 11, or may be disposed on an external control IC (integrated circuit), which is connected to the sensor substrate 11. Moreover, the circuit portion may be formed on another substrate, which is connected through a cable or the like.

The system control unit 26 receives a clock given from the outside, data for instructing an operation mode, and the like, and outputs data such as internal information of the radiation detector 1. The system control unit 26 further includes a timing generator configured to generate various timing signals, and controls driving of the row scanning unit 23, the column scanning unit 25, and the like, based on various timing signals generated by the timing generator.

Figure 3:
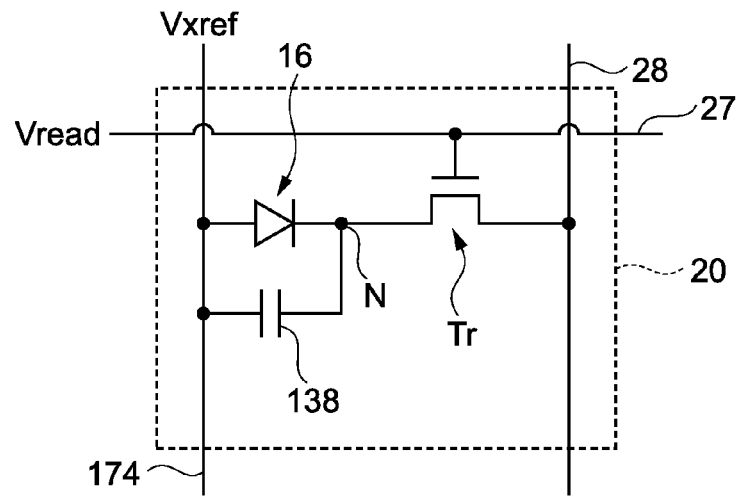
FIG. 3 shows an example of a pixel circuit driven by the pixel drive circuit shown in FIG. 2.

FIG. 3 shows an example of a circuit (pixel circuit 20) of the pixel PX driven by the pixel drive circuit shown in FIG. 2.

The pixel circuit 20 is, for example, a circuit using a passive matrix driving method, and includes the photodiode 16, a capacitor 138, and the transistor Tr.

The photodiode 16 is a device generating an amount of signal charge depending on the amount of incident light (amount of received light). The photodiode 16 and the capacitor 138 are connected in parallel to a supplying line 174 of a reference potential Vxref. Specifically, the photodiode 16 is connected between the supplying line 174 and a storage node N, which is an end of the capacitor 138.

To the row selection line 27, a row operation signal (read signal) Vread is supplied. A gate of the transistor Tr is connected to the row selection line 27, and the source and drain are connected to the storage node N and the signal line 28, respectively. By applying voltage corresponding to the row operation signal Vread to the gate of the transistor Tr, an amount of signal charge depending on the amount of received light of the photodiode 16, which is stored in the capacitor 138, is output to the signal line 28 via the storage node N.

Apparatus for Manufacturing Scintillator Layer

Figure 4:
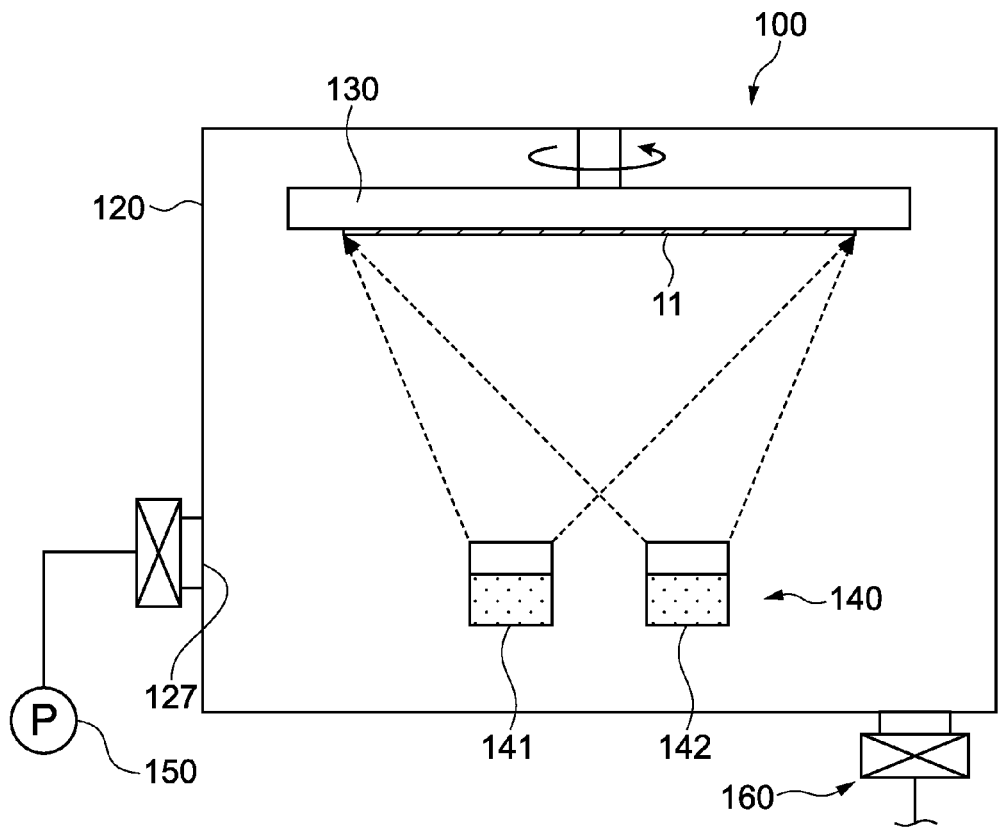
FIG. 4 is a diagram schematically showing a vacuum deposition apparatus for mainly manufacturing a scintillator layer in the radiation detector.

FIG. 4 is a diagram schematically showing a vacuum deposition apparatus as an apparatus for mainly manufacturing the scintillator layer 12 in the radiation detector 1.

A vacuum deposition apparatus 100 includes a vacuum chamber 120, a vacuum pump 150 connected via an exhaust vent 127 in the vacuum chamber 120, and a gas introduction unit 160 introducing a predetermined gas into the vacuum chamber 120. Moreover, the vacuum deposition apparatus 100 includes a substrate holder 130 holding a substrate (in this embodiment, the sensor substrate 11), which is disposed in the vacuum chamber 120, and a heating evaporation unit 140, which is disposed in the vacuum chamber 120 and evaporates a phosphor material.

The heating evaporation unit 140 includes, for example, an evaporation source 141 of CsI powder and an evaporation source 142 of TlI powder as a phosphor material. The evaporation sources 141 and 142 are typically configured by containing the powder in the respective evaporation containers. The evaporation sources 141 and 142 are separately heated at respective temperatures by a heating mechanism (heater or electron beam) (not shown). Moreover, between the sensor substrate 11 and the evaporation sources 141 and 142, a shutter (not shown) for interrupting or releasing a trajectory of a phosphor material is provided.

The substrate holder 130 may be configured to be capable of rotating. Accordingly, it is possible to form a scintillator layer having film properties such as a uniform film thickness in a plane of the substrate.

Method of Manufacturing Scintillator Layer

Figure 5:
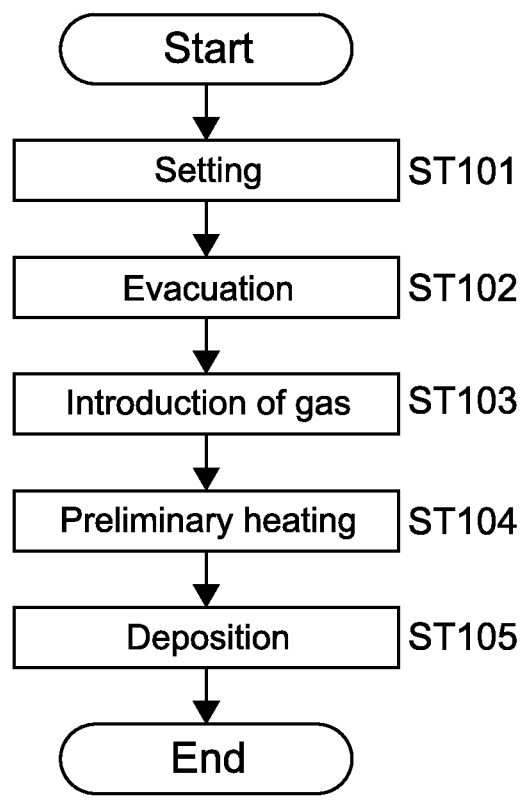
FIG. 5 is a flowchart showing a method of manufacturing the scintillator layer by using the vacuum deposition apparatus.

FIG. 5 is a flowchart showing a method of manufacturing a scintillator layer by using the vacuum deposition apparatus.

Setting before starting an operation is first performed by the vacuum deposition apparatus 100 (Step 101). The setting includes holding of the sensor substrate 11 by the substrate holder 130, and injection of the evaporation sources 141 and 142 (injection of CsI powder and TlI powder into the evaporation containers).

The vacuum chamber 120 is evacuated (Step 102). The pressure in the vacuum chamber 120 after the evacuation is set to, for example, not more than $5.0 \times 10^{-4}$ Pa.

A predetermined gas is introduced into the vacuum chamber 120 (Step 103). For example, an Ar gas (or another inert gas) may be introduced, and the flow rate of the gas is controlled by a mass flow meter or the like. In this way, the pressure in the vacuum chamber 120 is adjusted to, for example, 0.1 Pa.

Until the temperature of the respective evaporation sources 141 and 142 becomes a temperature suitable for starting deposition, preliminary heating in the heating evaporation unit 140 is performed (Step 104). Until the deposition is started, the shutter is closed.

The shutter (now shown) is opened, and deposition is started (Step 105). Then, the deposition is continued until a scintillator layer has a predetermined film thickness (e.g., 500 μm). After the scintillator layer is formed, heat treatment is performed as necessary.

In the deposition process, for example, by using a film thickness sensor (e.g., known sensor using two crystal oscillators) to monitor the evaporation rate (deposition rate) of CsI and TlI, the concentration of Tl in the film to be formed is controlled. The film thickness sensor can be disposed on the periphery of the substrate held by the substrate holder 130 in the vacuum chamber 120, for example. Specifically, a current value (or voltage value) applied to the respective heating mechanisms of the evaporation sources 141 and 142 is controlled so that the evaporation rate becomes an intended evaporation rate.

In fact, a calibration curve of the evaporation rate (film thickness) or concentration with respect to a frequency of oscillation of the crystal oscillator is created in advance. Specifically, the frequency, the evaporation rate, and the concentration are represented by a table or function, which can be converted to each other, and the table or function is stored in a memory by a control unit (not shown) in the vacuum deposition apparatus 100. In the deposition process, the control unit uses the data to perform the control, thereby obtaining a desired concentration distribution of Tl in the film thickness direction.

In this embodiment, as described above, by increasing the concentration of Tl at the initial stage of the deposition, in the direction of the thickness of the scintillator layer 12, the high-concentration area 12a of Tl can be formed from an end portion on a side of the sensor substrate 11 in the scintillator layer 12 (portion closest to the side of the sensor substrate 11). After that, by controlling the deposition rate so that the concentration of Tl is decreased, the low-concentration area 12b of Tl can be formed on the high-concentration area 12a. Accordingly, a scintillator layer having properties of good radiation conversion efficiency is formed. Specifically, it is possible to attain a radiation detector having high sensitivity.

The principle for realizing high sensitivity and high resolution by a concentration distribution of an activator is as follows.

Figure 6:
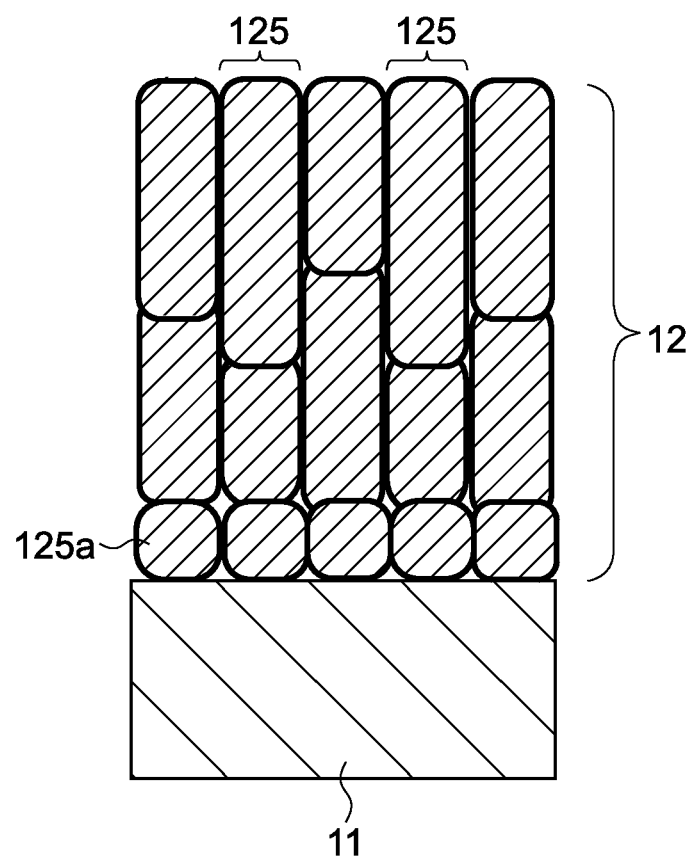
FIG. 6 schematically shows an initial state of deposition focusing on columnar crystals in a scintillator layer according to an embodiment of the present disclosure.
Figures 7, 8:
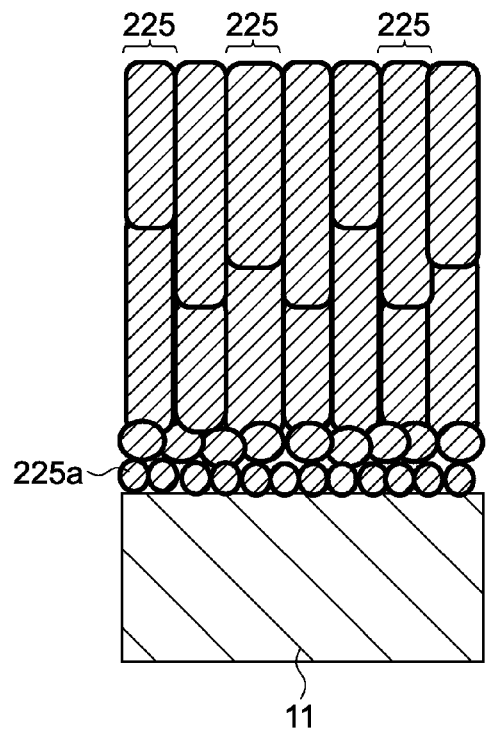
FIG. 7 schematically shows an initial state of deposition focusing on columnar crystals in a scintillator layer according to a comparative example of the present disclosure.
FIG. 8 is a table showing the properties of the columnar crystals or scintillator layer in the case where the concentration distribution of the activator is constant, and in the case where a base is formed by forming a high-concentration area.

FIG. 6 schematically shows the initial state of the deposition focusing on columnar crystals. FIG. 7 is a diagram according to a comparative example of the present disclosure, and is a schematic diagram showing the columnar crystals in the case where the concentration distribution of the activator in the entire scintillator layer is constant.

As shown in FIG. 7, columnar crystals 225 in the case where the concentration distribution of the activator is constant are formed such that a plurality of small balls 225a are overlaid one on the other at the initial stage of growth. Therefore, light is easily diffused, and the resolution is decreased. Moreover, there is a small ball having low crystallinity at the initial stage of growth, or the column at the initial stage, which has grown from the ball, has a thin diameter. As a result, the brightness is low.

On the other hand, in the case of columnar crystals 125 according to an embodiment of the present disclosure, the size of a ball 125a is large at the initial stage of crystal growth, and isolation between one columnar crystal and peripheral columnar crystals adjacent thereto is improved. Accordingly, the resolution is improved. Moreover, because a portion at the initial stage of growth is large, the brightness is improved.

Because sufficiently many columnar crystals are formed in the area of the pixel PX (see FIG. 1), even if isolation between the columnar crystal 125 and peripheral columnar crystals 125 adjacent thereto is low, it is considered that the resolution or the brightness is not decreased. However, it is not true. As shown in the following experimental example, there is a favorable range of the thickness of the high-concentration area (or Tl concentration ratio to be described later) in which the resolution becomes higher as the amount of light having reached the adjacent columnar crystals becomes smaller.

FIG. 8 is a table showing the properties of the columnar crystals or scintillator layer in the case where the high-concentration area is not formed (the thickness of the high-concentration area is 0 μm, i.e., the concentration distribution of the activator is constant), and in the case where a base is formed by forming the high-concentration area (the thickness of the high-concentration area is 25 to 100 μm). The table shows the results obtained from the experiment conducted by the inventors of the present disclosure.

In the experiment, CsI was used as a main component of a phosphor material, and Tl was used as an activator. The thickness of the scintillator layer was 500 μm. As will be described later, in the table shown in FIG. 8, the ratio (hereinafter referred to as concentration ratio) of the concentration of Tl (average concentration of Tl) in the high-concentration area to the concentration of Tl (average concentration of Tl) in the low-concentration area is fixed at 1.2 times.

Moreover, in FIG. 8, the resolution and brightness of the scintillator layer having a constant concentration distribution are regarded as 100%, which are used as a reference, and the resolution and brightness (brightness ratio) of the scintillator layer in which the high-concentration area is formed are shown.

In FIG. 8, a method of measuring diameters (widths) a and b of a root portion (end portion closest to the sensor substrate) and a tip portion (end portion farthest from the sensor substrate) of the columnar crystal 125 shown in FIG. 6 is as follows. In the method of measuring the diameter of the tip portion, the inventors of the present disclosure coated an upper surface (surface opposite to the sensor substrate 11) of a scintillator layer with a conductive material after the deposition of the scintillator layer, randomly selected 30 columnar crystals as samples from an image obtained with a scanning electronic microscope, measured the diameters of the columnar crystals, and calculated the average value of the measured diameters. The diameter is an equivalent circle diameter. On the other hand, in the method of measuring the diameter of the root portion, a scintillator layer was removed from a sensor substrate after the deposition of the scintillator layer, a removed surface was coated with a conductive material, 30 columnar crystals were randomly selected as samples from an image obtained with a scanning electronic microscope, the diameters of the columnar crystals were measured, and the average value of the measured diameters were calculated. The diameter is an equivalent circle diameter.

Moreover, the inventors of the present disclosure used a tungsten plate having a thickness of 1 mm to calculate the MTF (modulation transfer function) using the edge method, and evaluated the resolution at 1 lp/mm. The radiation quality used was RQA5. It should be noted that the width b of the tip portion is a value at a position, which has the largest diameter, in the vicinity of the tip of the columnar crystal 125.

From the experimental results, it is found that the brightness and resolution of the scintillator layer in which a high-concentration area has been formed are improved. In particular, in the case where the thickness of the high-concentration area is not less than 25 μm and not more than 50 μm, the resolution and brightness are improved. Even in the case where the thickness of the high-concentration area is 75 μm, the resolution is 98%, which is almost the same as that in the scintillator layer having the constant concentration distribution. Specifically, the thickness of the high-concentration area is favorably not less than 25 μm and not more than 50 μm (not less than 5% and not more than 15% of the thickness of the scintillator layer).

Moreover, the ratio of the width b of the tip portion of the columnar crystal and the width a of the root portion of the columnar crystal (b/a=5.0/1.1) in the scintillator layer having the constant concentration distribution is larger than that in the case where the high-concentration area is formed. In this case, b/a in the case where the thickness of the high-concentration area is 25 to 75 μm is as follows.

Thickness of 25 μm: b/a=1.514
Thickness of 50 μm: b/a=1.757
Thickness of 75 μm: b/a=2.675

Specifically, in the case where the thickness of the high-concentration area is 25 to 75 μm, b/a is favorably 1.5 to 2.7. On the other hand, in the case of the columnar crystal having a constant concentration distribution, b/a is 4.545.

Figures 9, 10:
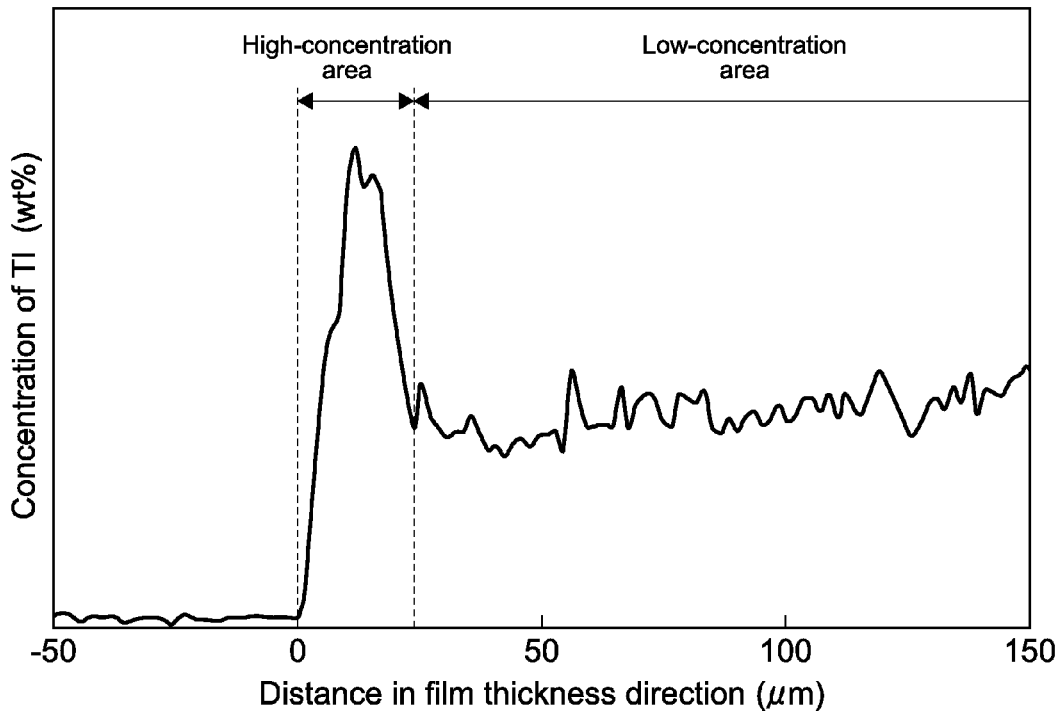
FIG. 9 is a graph showing a concentration distribution (% by weight) of Tl in a scintillator layer whose high-concentration area has a thickness of 25 μm, out of the scintillator layers shown in FIG. 8.
FIG. 10 is a table showing the properties of scintillator layers formed by fixing the thickness of the high-concentration area to 25 μm and changing the Tl concentration ratio.

FIG. 9 is a graph showing a concentration distribution (% by weight) of Tl in a scintillator layer whose high-concentration area has a thickness of 25 μm, out of the scintillator layers shown in FIG. 8. The method of measuring the concentration distribution is as follows.

A sample obtained by depositing carbon on a cross-sectional sample, which was prepared using the CP (cross-section polishing) method, was measured.

A cross-sectional profile of the scintillator layer in the depth direction (thickness direction) was measured by an EPMA (electron probe micro analyzer).

The acceleration voltage was 15 kV, the irradiation voltage was 15 kV, and the irradiation current was 40 nA.

The measurement time was 30 msec, and the beam size was 1 μm.

The average values of the concentrations of Tl in the high-concentration area and the low-concentration area were calculated, and the ratio of the calculated average values were the above-mentioned Tl concentration ratio.

The starting point of the high-concentration area is a first position where a signal is detected by the measurement apparatus, and the end point of the low-concentration area is a first position where the signal is not detected.

FIG. 10 is a table showing the properties of scintillator layers formed by fixing the thickness of the high-concentration area to 25 μm and changing the Tl concentration ratio. The resolution and brightness of the scintillator layer in which the Tl concentration ratio is 1.0, i.e., the high-concentration area is not formed, are regarded as 100%, as in the table of FIG. 8.

In the scintillator layers in which the Tl concentration ratios range from 1.1 to 1.3, the resolution and the brightness ratio are improved. Out of the scintillator layers, the scintillator layer in which the Tl concentration ratio is 1.2 is optimal. Therefore, the first position from the position having the highest concentration (% by weight) of the activator on the side of the sensor substrate 11, which has the concentration of not more than 10/11 (about 0.91 (reciprocal of 1.1)) of the highest concentration in the direction away from the sensor substrate 11, can be defined as a boundary between the high-concentration area and the low-concentration area.

In the case where the Tl concentration ratio is 1.1 to 1.3, b/a is as follows.

Tl concentration ratio of 1.1 μm: b/a=2.364
Tl concentration ratio of 1.2 μm: b/a=1.51
Tl concentration ratio of 1.3 μm: b/a=1.182

Specifically, in the case where the Tl concentration ratio is 1.1 to 1.3, b/a is favorably 1.2 to 2.4.

Other Embodiments

Embodiments of the present disclosure are not limited to the above-mentioned embodiments and various modifications can be made.

The radiation detector may include a counter substrate for sealing, on the scintillator layer.

In the case where a counter electrode is provided, for example, as a method of manufacturing the radiation detector, the scintillator layer may be formed on the counter substrate by the above-mentioned deposition process. In this case, the method of manufacturing the scintillator layer is the same as the above-mentioned method.

In this case, on the side of the counter substrate, the scintillator layer is formed so as to have a thickness of not less than 300 μm and not more than 800 μm. It is favorable that the high-concentration area of the activator is disposed on an end portion of the side of the counter electrode in the scintillator layer (i.e., at the initial stage of deposition) in the thickness direction of the scintillator layer, and the high-concentration area is formed so as to have a thickness of not less than 10 μm and not more than 100 μm.

The present disclosure may also take the following configurations.

(1) A radiation detector, including
a sensor substrate configured to be capable of performing photoelectric conversion; and
a scintillator layer including a first area and a second area, the first area including an activator, the second area including the activator with a concentration lower than the concentration of the activator in the first area, the scintillator layer being provided on the sensor substrate so that the first area and the second area are arranged in a thickness direction of the scintillator layer and the first area is arranged from an end portion on a side of the sensor substrate in the scintillator layer in the thickness direction.

(2) The radiation detector according to (1), in which
the scintillator layer has a thickness of not less than 300 μm and not more than 800 μm.

(3) The radiation detector according to (2), in which
the scintillator layer includes a phosphor material of CsI as a main component, and the activator includes Tl.

(4) The radiation detector according to (3), in which the first area has a thickness of not less than 2% and not more than 20% of the thickness of the scintillator layer.

(5) The radiation detector according to (4), in which
the thickness of the first area is not less than 5% and not more than 15% of the thickness of the scintillator layer.

(6) The radiation detector according (4) or (5), in which
the concentration of the activator in the first area is not less than 1.1 times and not more than 1.3 times that in the second area.

(7) The radiation detector according to (6), in which
the concentration of the activator in the first area is 1.2 times that in the first area.

(8) A radiation detector, including:
a sensor substrate configured to be capable of performing photoelectric conversion;
a counter substrate provided so as to face the sensor substrate; and
a scintillator layer provided on the sensor substrate between the sensor substrate and the counter substrate so as to have a thickness of not less than 300 μm and not more than 800 μm, the scintillator layer including a first area and a second area, the first area including an activator and being provided so as to have a thickness of not less than 10 μm and not more than 100 μm, the second area including the activator with a concentration lower than the concentration of the activator in the first area, the scintillator layer being provided on the sensor substrate so that the first area and the second area are arranged in a thickness direction of the scintillator layer and the first area is arranged from an end portion on a side of the counter substrate in the scintillator layer in the thickness direction.

(9) A method of manufacturing a radiation detector, including:
forming a first area on a sensor substrate, the first area including an activator, the sensor substrate being configured to be capable of performing photoelectric conversion; and forming a scintillator layer by forming a second area on the formed first area, the second area including the activator with a concentration higher than the concentration of the activator in the first area, the scintillator layer including the first area and the second area.

(10) A method of manufacturing a radiation detector, including:

forming a first area on a counter substrate, the first area including an activator and being provided so as to have a thickness of not less than 10 μm and not more than 100 μm; and forming a scintillator layer by forming a second area on the formed first area, the second area including the activator with a concentration lower than the concentration of the activator in the first area, the scintillator layer including the first area and the second area and having a thickness of not less than 300 μm and not more than 800 μm.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A radiation detector, comprising:
a sensor substrate configured to perform photoelectric conversion; and
a scintillator layer including a first area and a second area, the first area including an activator, the second area including the activator with a concentration lower than a concentration of the activator in the first area, the scintillator layer being provided on the sensor substrate such that the first area is arranged between the second area and the sensor substrate in a thickness direction of the scintillator layer.

2. The radiation detector according to claim 1, wherein the scintillator layer has a thickness of not less than 300 μm and not more than 800 μm.

3. The radiation detector according to claim 1, wherein the scintillator layer includes a phosphor material of CsI as a main component, and the activator includes Tl.

4. The radiation detector according to claim 1, wherein the first area has a thickness of not less than 2% and not more than 20% of a thickness of the scintillator layer.

5. The radiation detector according to claim 4, wherein the thickness of the first area is not less than 5% and not more than 15% of the thickness of the scintillator layer.

6. The radiation detector according to claim 1, wherein the concentration of the activator in the first area is not less than 1.1 times and not more than 1.3 times that in the second area.

7. The radiation detector according to claim 1, wherein the concentration of the activator in the first area is 1.2 times that in the second area.

8. The radiation detector according to claim 1, further comprising a counter substrate formed on the second area to provide protection to the scintillator layer.

9. A radiation detector, comprising:
a sensor substrate configured to be capable of performing photoelectric conversion;
a counter substrate provided so as to face the sensor substrate; and
a scintillator layer provided on the sensor substrate between the sensor substrate and the counter substrate so as to have a thickness of not less than 300 μm and not more than 800 μm, the scintillator layer including a first area and a second area, the first area including an activator and being provided so as to have a thickness of not less than 10 μm and not more than 100 μm, the second area including the activator with a concentration lower than the concentration of the activator in the first area, the scintillator layer being provided on the sensor substrate so that the first area and the second area are arranged in a thickness direction of the scintillator layer and the first area is arranged from an end portion on a side of the counter substrate in the scintillator layer in the thickness direction.

10. A method of manufacturing a radiation detector, comprising:
forming a first area on a sensor substrate, the first area including an activator, the sensor substrate being configured to perform photoelectric conversion; and
forming a scintillator layer by forming a second area on the formed first area, wherein the second area includes the activator with a concentration lower than a concentration of the activator in the first area adjacent to the sensor substrate, wherein the scintillator layer includes the first area and the second area.

11. The method according to claim 10, wherein the first area is formed to have a thickness of not less than 2% and not more than 20% of a thickness of the scintillator layer.

12. The method according to claim 11, wherein the thickness of the first area is not less than 5% and not more than 15% of the thickness of the scintillator layer.

13. The method according to claim 10, wherein the concentration of the activator in the first area is not less than 1.1 times and not more than 1.3 times that in the second area.

14. The method according to claim 10, wherein the concentration of the activator in the first area is 1.2 times that in the second area.

15. A method of manufacturing a radiation detector, comprising:
forming a first area on a sensor substrate, the first area including an activator and being provided so as to have a thickness of not less than 10 μm and not more than 100 μm; and
forming a scintillator layer by forming a second area on the formed first area, the second area including the activator with a concentration lower than the concentration of the activator in the first area, the scintillator layer including the first area and the second area, wherein the scintillator layer formed on the sensor substrate between the sensor substrate and a counter substrate and having a thickness of not less than 300 μm and not more than 800 μm, wherein the counter substrate provided so as to face the sensor substrate.

* * * * *